United States Patent [19]

Mycynek

[11] Patent Number: 4,654,707

[45] Date of Patent: Mar. 31, 1987

[54] METHOD AND APPARATUS FOR VOLUME CONTROL OF A BTSC MULTI-CHANNEL SOUND SIGNAL

[75] Inventor: Victor G. Mycynek, Des Plaines, Ill.

[73] Assignee: Zenith Electronics Corporation, Glenview, Ill.

[21] Appl. No.: 720,832

[22] Filed: Apr. 8, 1985

[51] Int. Cl.[4] .............................................. H04N 7/04
[52] U.S. Cl. .................................. 358/144; 358/198; 381/2; 381/104
[58] Field of Search ........................ 358/143, 144, 198; 381/1, 2, 10, 103, 104

[56] References Cited

U.S. PATENT DOCUMENTS

| | | | |
|---|---|---|---|
| 4,389,536 | 6/1983 | Schickedanz | 381/2 |
| 4,399,329 | 8/1983 | Wharton | 358/144 |
| 4,461,021 | 7/1984 | Schwarz et al. | 158/144 |
| 4,512,031 | 4/1985 | Van Gils | 358/144 |
| 4,571,622 | 2/1986 | Davidon et al. | 358/198 |

OTHER PUBLICATIONS

"TV Multichannel Sound—The BTSC System", by Eilers, 2/1985, IEEE Trans. on Consumer Electronics, vol. CE-31, No. 1.

Primary Examiner—Jin F. Ng

[57] ABSTRACT

A volume control circuit for a BTSC multi-channel signal includes a trap for the SAP frequency components, a pair of delay lines and a combiner circuit forming a transversal equalizer for shaping a frequency response characteristic that attenuates stereo L+R low frequency components more than L−R mid-frequency components, a pilot frequency trap and a resistance controlled inverting amplifier, all for producing a variable frequency response in a first path. A fixed frequency response, complementary to that at minimum attenuation in the first path, is provided in a second path, the outputs of the two paths being combined to produce an overall frequency response that is variable from unity across the frequency band to a response corresponding to that in the second path. The pilot and SAP frequency components are never attenuated and the L+R frequency components are attenuated at a greater rate than the L−R frequency components to approximate the effects of the dbx expansion of the L−R frequency components in the following stereo or multichannel television receiver.

7 Claims, 3 Drawing Figures

METHOD AND APPARATUS FOR VOLUME CONTROL OF A BTSC MULTI-CHANNEL SOUND SIGNAL

BACKGROUND OF THE INVENTION AND PRIOR ART

This invention relates generally to stereo sound signals and specifically to a simple stereo volume control and method for use in a television signal decoder.

Recently, stereo sound and second audio programming (SAP) have been authorized by the FCC for television signal transmissions. The Broadcast Television Systems Committee (BTSC)-approved multi-channel sound signal comprises preemphasized left (L)+right (R) stereo signal components, L−R stereo signal components, AM modulated on a 2.0 f suppressed subcarrier, a 1.0 f pilot signal component for regenerating the suppressed subcarrier and a 5.0 f SAP FM subcarrier component. The frequency f corresponds to the horizontal line frequency of a television signal, namely 15.734 KHz. The L+R information is thus below 15.734 whereas the L−R subcarrier is centered at 31.468 KHz and the SAP subcarrier is at 78.67 KHz. During encoding the L−R signal is compressed to enhance its signal to noise characteristics and thereby improve received sound quality. The transmitted audio signal is thus more than a simple combination of sum and difference signals but has the sum and difference components weighted in a non-linear manner. Thus providing a volume control that maintains proper stereo separation and proper left and right signal balance is quite difficult.

In a stereo television receiver, the BTSC signal is partially decoded, forming the deemphasized [L+R] signal and the still compressed [L−R] signal. The [L−R] signal is then expanded and matrixed with the [L+R] signal to form L and R signal components which may then be individually and simultaneously controlled to adjust their respective loudness levels. The SAP signal, if any, is separately detected and reproduced.

Many viewers receive cable television signals by means of a converter/decoder provided by the cable systems operator. The converter/decoder is interposed between the cable-connected television signals and the subscriber's television receiver. The cable operator may also provide a remote control option with the converter/decoder to enable subscribers to control channel selection, volume, etc. from a remote point. There are also stereo adapters for enabling subscribers having "monaural" television receivers to enjoy television transmissions with stereo sound. As will be seen, the remotely controllable functions on appropriately equipped television receivers are rarely fully used because of the presence of the converter/decoder.

Cable signals are supplied at selected television carrier frequencies, demodulated to baseband frequency, remodulated to a frequency corresponding to VHF channel 3/4 and coupled to the viewer's television receiver antenna input terminals. Thus the television receiver is always tuned to either channel 3 or channel 4 and a remote channel change feature is of little practical value. A similar situation generally obtains with volume control. For monaural audio, the decoder may decode the television audio signal to baseband frequency and enable direct volume control before FM modulating it to a 4.5 MHz carrier, which then becomes part of the composite video signal and is remodulated to channel 3/4. With a BTSC stereo signal, however, a major difficulty is encountered in attempting to control volume in the decoder. Because of the compressed nature of the signal, the BTSC signal must be decoded, expanded and matrixed to obtain the correct L and R signal components. The L and R signal amplitudes may then be varied for volume control and reencoded into the BTSC stereo format, FM modulated onto a 4.5 MHz carrier and subsequently remodulated, along with the other parts of the television signal, to channel 3/4. A stereo television receiver is equipped to process the BTSC stereo signal and reproduce the gain-controlled L and R signals. Similarly, if a separate stereo adapter is used with the decoder, the adapter will include the requisite BTSC decoding circuitry. It is readily apparent that it is a significant complication and expense for a cable operator to provide the necessary BTSC decoding and encoding audio circuitry in the decoder to enable volume control by means of the decoder remote control unit.

Accordingly, there is a need in the art for a simple BTSC stereo volume control for use in a television decoder.

OBJECTS OF THE INVENTION

A principal object of the invention is to provide a novel BTSC stereo signal volume control for a television decoder.

Another object of the invention is to provide a low cost BTSC stereo signal volume control for an encoded television signal.

A further object of the invention is to provide a simple control for a BTSC stereo signal that exhibits good stereo separation and balance.

The BTSC multi-channel signal is subjected to non-linear compression for noise minimization. Thus the relationship between the L−R subcarrier information and the L+R main channel or monaural information is not linear. Consequently, adjustment of the levels of both signal portions, that is, the L+R and the L−R signal portions, will not yield uniform levels in the reproduced L and R signals after decoding. The BTSC signal must be detected, the L−R compressed portion must be expanded, the L and R signals obtained by matrixing, their levels changed as desired, the "new" L and R signals rematrixed, the L−R portions compressed and the entire signal reencoded. The process is expensive and cumbersome. The volume control of the invention approximates the desired overall BTSC signal response curve to produce good stereo at different levels of signal and generates a gain control characteristic that adjusts the various portions of the encoded and undetected signal in approximately inverse relationship to that determined response curve. When the BTSC signal is subsequently decoded, expanded and matrixed to form the L and R signals, the effect of the signal level adjustment is approximately the same on the L signal as on the R signal with no substantial loss of stereo separation.

BRIEF DESCRIPTION OF THE DRAWINGS

Further objects and advantages of the invention will be apparent upon reading the following description in conjunction with the drawings in which.

DESCRIPTION OF THE PREFERRED EMBODIMENT

Figure 1:
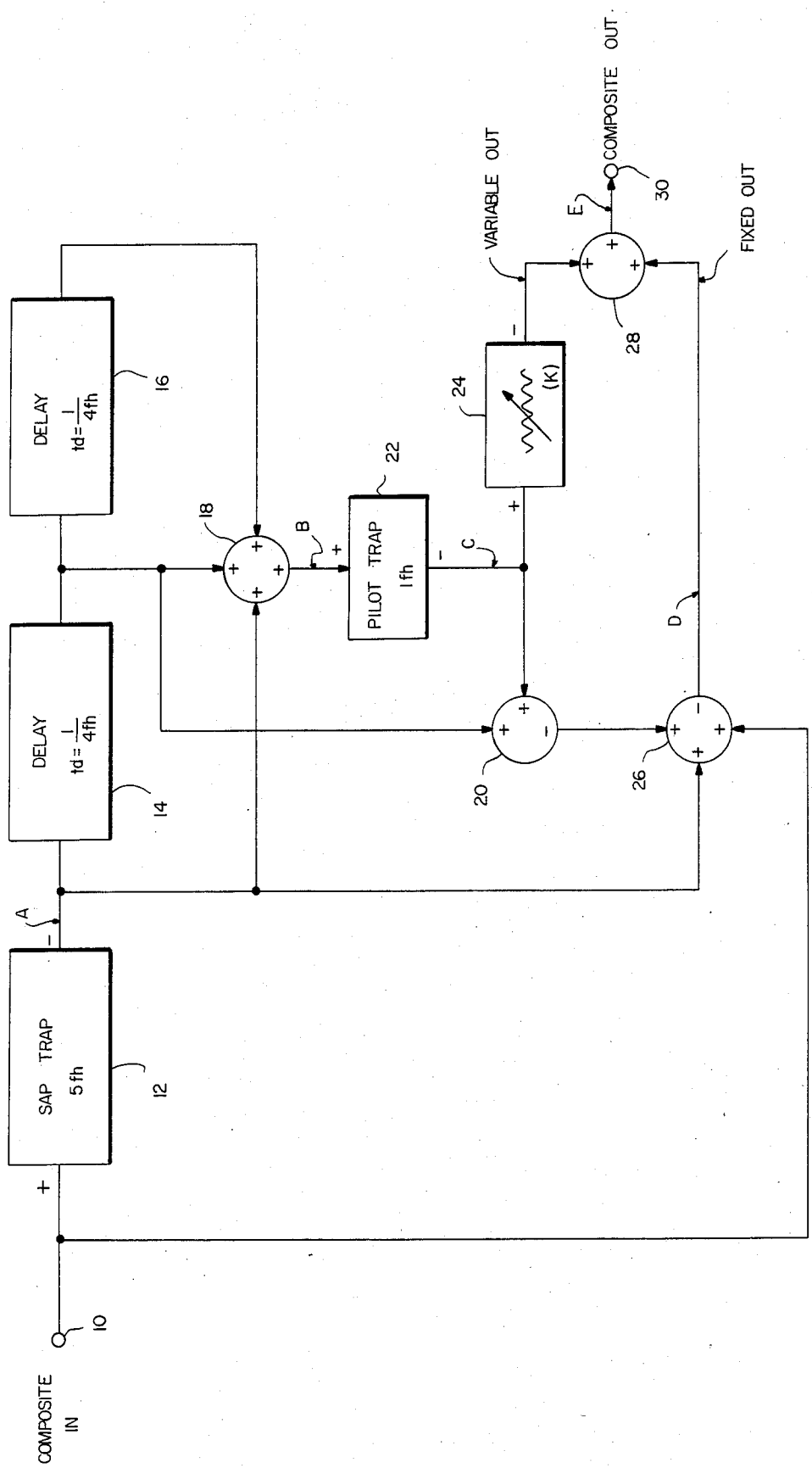
FIG. 1 is a block diagram of the system of the invention.

Referring to FIG. 1, an input terminal 10 receives a BTSC encoded composite stereo signal which is coupled to a second audio program (SAP) trap 12 and to one input of a three-input combiner circuit 26. The BTSC signal consists of an L+R component, a pilot signal component at 1 $f_h$, a suppressed carrier L−R, compressed stereo component and a SAP signal centered about a 5 $f_h$ carrier frequency. Trap 12 removes SAP related frequencies near 5 $f_h$. Its output is coupled to a delay line 14 which, in turn, is coupled to another delay line 16. The output of SAP trap 12 is also coupled to one input of a three-input combiner circuit 18 and to a second input of combiner circuit 26. The output of delay line 14 is coupled to a second input of combiner circuit 18 and to a first input of a two-input combiner circuit 20. The last input of combiner circuit 18 is supplied from the output of delay line 16 and its output is supplied to a 1 $f_h$ pilot trap 22. The output of the pilot trap is supplied to the second input of combiner circuit 20 and to a resistance controlled inverting amplifier 24. The output of combiner circuit 20 is supplied to the third input of combiner 26, the output of which is coupled to a first input of a two-input combiner circuit 28, the other input of which is supplied from inverting amplifier 24. The output of combiner circuit 28 is coupled to output terminal 30 at which the gain controlled BTSC composite output signal is present.

The characteristics of delay lines 14 and 16 are identical. Each introduces a delay of ¼ $f_h$, which translates to 15.89 microseconds. The arrangement of the delay lines and combining circuit 18 comprises a transversal equalizer, which those skilled in the art will recognize as providing a predetermined amplitude response and constant delay with frequency. The signal path identified by the legend VARIABLE OUT will be seen to exhibit a gain varying frequency response characteristic, whereas that labelled FIXED OUT exhibits a fixed, though non-uniform, frequency response characteristic.

The two signal paths share a number of elements. The first path is traced through SAP trap 12, with a split to combiner 18 and delay circuit 14, another split to combiner 18 and delay circuit 16, through pilot trap 22 and through amplifier 24. The second path shares the first path up to variable amplifier 24. It also includes the signal from delay line 14 combined with the output of pilot trap 22 in combiner 20, and is completed with combiner 26 which is supplied with the direct composite BTSC signal and the output of SAP trap 12.

Figure 2:
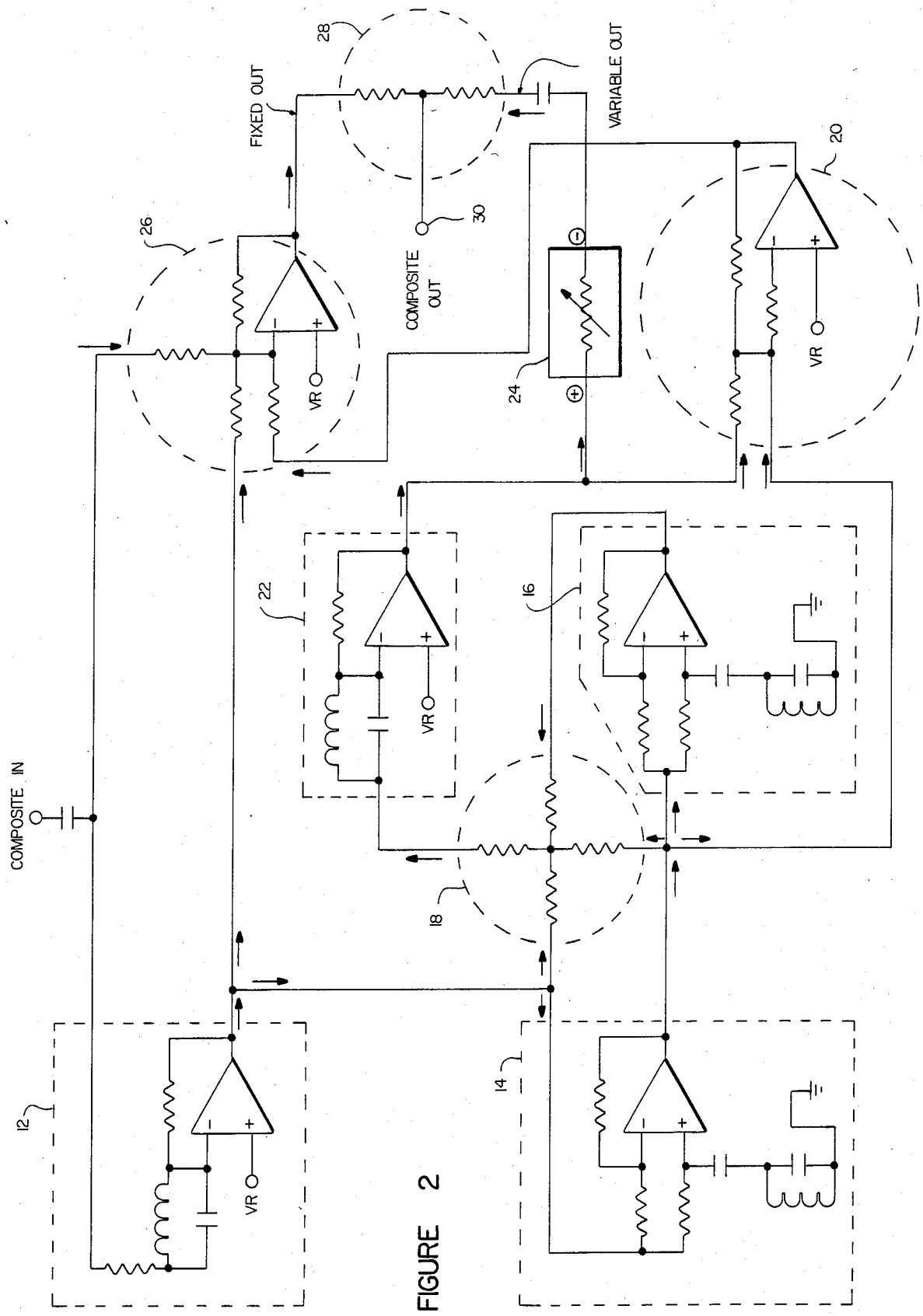
FIG. 2 is a schematic diagram of the system of the invention.

In FIG. 2 the circuits elements of FIG. 1 are shown with the blocks being indicated by dashed line rectangles and circles. SAP trap 12 includes an operational amplifier and a parallel connection of a capacitor and an inductor. Delay lines 14 and 16 comprise operational amplifiers with resistance, capacitance and inductive elements connected as shown. The combiner circuits 18 and 28 consist of resistors only, whereas combiner circuits 20 and 26 include operational amplifiers. The volume control circuit arrangement will be seen to provide two signal paths of complementary predetermined frequency responses, one of which is variable, by action of the resistance controlled amplifier, and the other of which is fixed. The shape of the frequency response characteristic is determined with the known characteristics of the BTSC stereo signal in mind. Generally, the volume control circuit is designed to attenuate the L+R components at a faster rate than the L−R components and to not attenuate the pilot frequency and the SAP carrier frequency. The attenuation is not linear with gain factor (K) of the resistance controlled inverting amplifier but is proportioned to maintain stereo separation between, and equal volume levels of, the reproduced L and R signals over the full range of loudness levels.

Figure 3:
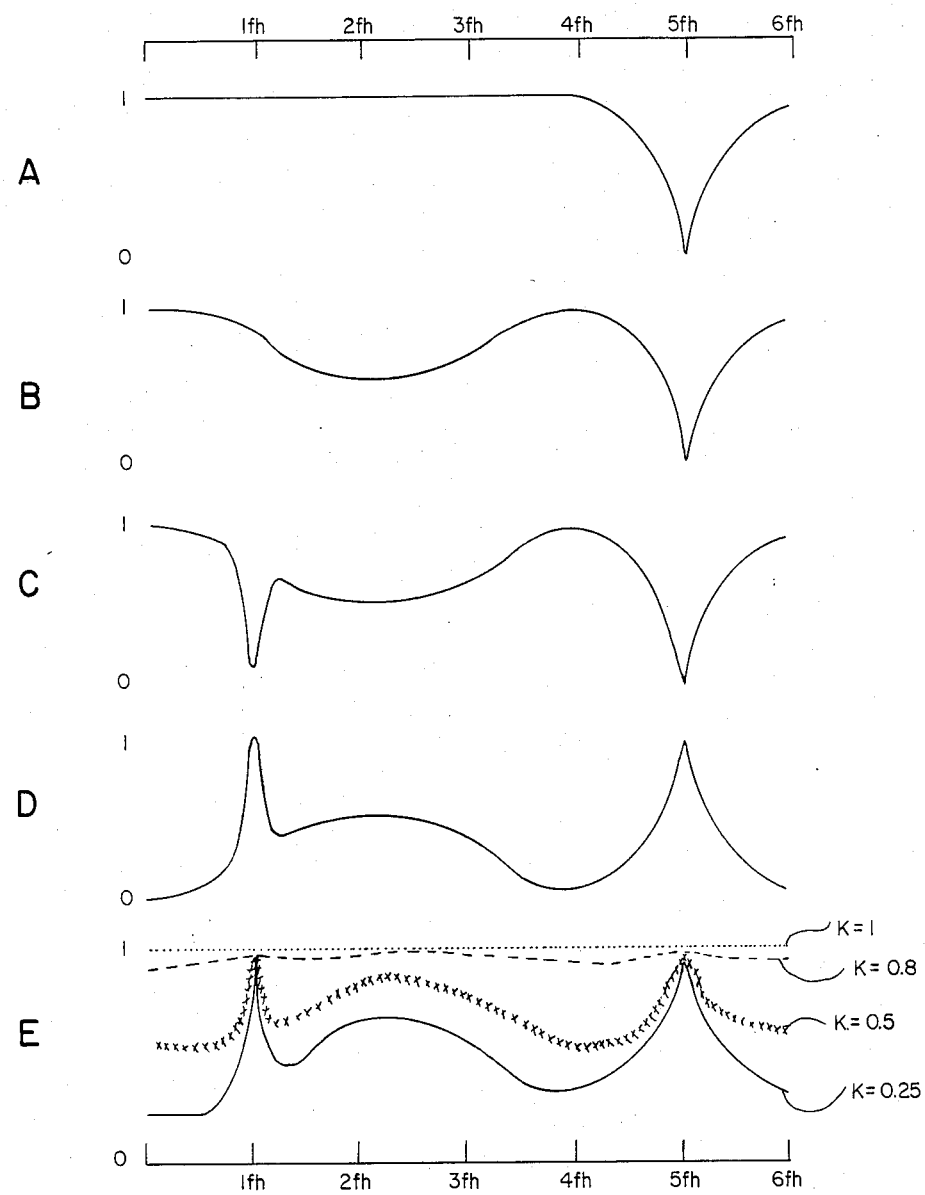
FIG. 3 is a series of frequency response waveforms at various points in the circuit.

Referring to FIG. 3, the waveforms labelled A, B, C, D and E indicate their normalized frequency response over a range of frequencies from 0 to 6 $f_h$. Curve A indicates the effect of SAP trap 12 which introduces a sharp notch at 5 $f_h$ in the response characteristic. Curve B represents the effect of the transversal equalizer and shows a marked reduction in amplitude about the 2 $f_h$ division corresponding to the L−R subcarrier frequency. Curve C indicates the effect of the pilot trap at 1 $f_h$ and, essentially, is the waveform of the frequency response of the VARIABLE OUT signal path of the circuit at maximum volume. This corresponds to K=1 for inverting amplifier 24. Curve D is essentially the inverse of curve C and represents the response of the FIXED OUT signal path of the circuit. Curve E shows a series of responses of the volume control circuit for different gain factors K. The dotted line represents a gain factor K=1, the dashed line a gain factor K=0.8, the X's a gain factor K=0.5 and the solid line a gain factor K=0.25. At K=1, that is with no attenuation of the BTSC composite signal, the overall frequency response is essentially a straight line, indicating that the volume control circuit has no effect on the BTSC signal. For increased attenuation, corresponding to decreased gain factor K, the frequency response approaches that of waveform D, corresponding to inverting amplifier 24 exerting a smaller effect on the BTSC composite output signal. Analysis of the individual waveforms in E shows that the signal components below 1 $f_h$, which correspond to L+R, are reduced more than the signal components between 1 $f_h$ and 3 $f_h$, corresponding to dbx-expanded L−R. With the circuit of the invention, the undecoded BTSC stereo signal may be subjected to a relatively simple volume control by controlling the gain of resistance controlled amplifier 24. The circuit of the invention thus accomplishes volume control without the need for decoding, expansion, matrixing, gain controlling of the resultant signals, matrixing, compression and re-encoding.

It is recognized that numerous changes and modifications in the described embodiment of the invention will be apparent to those skilled in the art without departing from its true spirt and scope. The invention is to be limited only as defined in the claims.

What is claimed is:

1. A method of controlling the level of a BTSC stereo encoded signal extending over a frequency band and including low frequency components, a pilot frequency component and higher frequency subcarrier components that have been dynamically compressed before encoding comprising the steps of:

applying said encoded signal to two paths exhibiting complementary frequency response characteristics with substantially no attenuation at said pilot frequency;

varying the gain of one of said paths; and combining the outputs of said two paths to create an overall frequency response characteristic that is variable from unity over said frequency band to the frequency characteristic defined by the nonvaried one of said paths.

2. The method of claim 1 wherein said frequency response characteristic attenuates said low frequency components more than said higher frequency dynamically compressed components.

3. The method of claim 2 further including still higher SAP frequency components and wherein the combined outputs provide substantially no attenuation for said SAP frequency components.

4. The method of claim 3 wherein said pilot frequency is at 15.734 KHz and said SAP frequency components are centered at 78.67 KHz.

5. A volume control circuit for a BTSC composite stereo signal consisting of L+R low frequency components, a pilot frequency component, L−R dynamically compressed mid-frequency components and SAP frequency components, comprising:
   means for supplying said BTSC composite signal to a first path and to a second path;
   means creating a frequency response for said second path characterized by less attenuation for said mid-frequency components than for said low frequency components and no attenuation for said pilot frequency component and said SAP frequency components;
   means providing a frequency response characteristic for said first path that is complementary to that for said second path;
   means for varying the gain of said first path; and
   means for combining the outputs of said first path and said second path to create an overall frequency response for said BTSC composite signal that is determined by the combined frequency responses of said first path and said second path.

6. The volume control of claim 5 further including a SAP trap, a transversal equalizer and a pilot trap for determining the frequency response characteristic of said first path.

7. The volume control of claim 6 wherein said gain varying means comprise a variable resistance and wherein said overall frequency response varies from unity at no attenuation by said variable resistance, to that defined by the frequency response of said second path at maximum attenuation by said variable resistance, the response for said pilot and said SAP frequency components being substantially unaffected by changes in attenuation by said variable resistance.

* * * * *